United States Patent
Han et al.

[11] Patent Number: 5,985,162
[45] Date of Patent: Nov. 16, 1999

[54] METHOD FOR FORMING SOFT ADJACENT LAYER (SAL) MAGNETORESISTIVE (MR) SENSOR ELEMENT WITH ELECTRICALLY INSULATED SOFT ADJACENT LAYER (SAL)

[75] Inventors: Cherng-Chyi Han; Mao-Min Chen; Kochan Ju, all of San Jose, Calif.

[73] Assignee: Headway Technologies, Inc., Milpitas, Calif.

[21] Appl. No.: 08/810,059

[22] Filed: Mar. 5, 1997

[51] Int. Cl.$^6$ ............................................. B44C 1/22
[52] U.S. Cl. ............................ 216/22; 216/41; 360/113
[58] Field of Search ......................... 216/22, 41; 360/113

[56] References Cited

U.S. PATENT DOCUMENTS

| | | | |
|---|---|---|---|
| 3,864,751 | 2/1975 | Beaulieu et al. | 360/113 |
| 4,024,489 | 5/1977 | Bajorek et al. | 338/32 |
| 4,713,708 | 12/1987 | Krounbi | 360/113 |
| 4,879,619 | 11/1989 | Fontana, Jr. et al. | 360/113 |
| 5,532,892 | 7/1996 | Nix et al. | 360/113 |
| 5,753,131 | 5/1998 | Choukh et al. | 216/22 |

*Primary Examiner*—Randy Gulakowski
*Assistant Examiner*—Shamm Ahmed
*Attorney, Agent, or Firm*—George O. Saile; Stephen B. Ackerman; Alek P. Szecsy

[57] ABSTRACT

A soft adjacent layer (SAL) magnetoresistive (MR) sensor element and a method for fabricating the soft adjacent layer (SAL) magnetoresistive (MR) sensor element. To practice the method, there is first provided a substrate. There is formed over the substrate a dielectric layer which has a first surface of the dielectric layer and a second surface of the dielectric layer opposite the first surface of the dielectric layer. There is also formed over the substrate a magnetoresistive (MR) layer in contact with the first surface of the dielectric layer. Similarly, there is also formed over the substrate a soft adjacent layer (SAL) in contact with the second surface of the blanket dielectric layer, where the magnetoresistive (MR) layer, the soft adjacent layer (SAL) and the dielectric layer are planar and preferably at least substantially co-extensive. The invention contemplates the soft adjacent layer (SAL) magnetoresistive (MR) sensor element formed through the method of the invention.

9 Claims, 4 Drawing Sheets

METHOD FOR FORMING SOFT ADJACENT LAYER (SAL) MAGNETORESISTIVE (MR) SENSOR ELEMENT WITH ELECTRICALLY INSULATED SOFT ADJACENT LAYER (SAL)

BACKGROUND OF THE INVENTION

1. Field of the Invention

The present invention relates generally to methods for fabricating magnetic sensor elements. More particularly, the present invention relates to methods for fabricating soft adjacent layer (SAL) magnetoresistive (MR) sensor elements.

2. Description of the Related Art

The recent and continuing advances in computer and information technology have been made possible not only by the correlating advances in the functionality, reliability and speed of semiconductor integrated circuits, but also by the correlating advances in the storage density and reliability of direct access storage devices (DASDs) employed in digitally encoded magnetic data storage and retrieval.

Storage density of direct access storage devices (DASDs) is typically measured as areal storage density of a magnetic data storage medium formed upon a rotating magnetic data storage disk within a direct access storage device (DASD) magnetic data storage enclosure. The areal storage density of the magnetic data storage medium is defined largely by the track width, the track spacing and the linear magnetic domain density within the magnetic data storage medium. The track width, the track spacing and the linear magnetic domain density within the magnetic data storage medium are in turn determined by several principal factors, including but not limited to: (1) the magnetic read-write characteristics of a magnetic read-write head employed in reading and writing digitally encoded magnetic data into and from the magnetic data storage medium; (2) the magnetic domain characteristics of the magnetic data storage medium; and (3) the separation distance of the magnetic read-write head from the magnetic data storage medium.

With regard to the magnetic read-write characteristics of magnetic read-write heads employed in reading and writing digitally encoded magnetic data into and from a magnetic data storage medium, it is known in the art of magnetic read-write head fabrication that magnetoresistive (MR) read-write heads are generally superior to other types of magnetic read-write heads when employed in retrieving digitally encoded magnetic data from a magnetic data storage medium. In that regard, magnetoresistive (MR) read-write heads are generally regarded as superior since magnetoresistive (MR) read-write heads are known in the art to provide high output digital read signal amplitudes, with good linear resolution, independent of the relative velocity of a magnetic data storage medium with respect to a magnetoresistive (MR) read-write head.

In order to optimize signal amplitude and performance of a magnetoresistive (MR) read-write head, it is known in the art of magnetoresistive (MR) read-write head fabrication to employ at least either: (1) a longitudinal magnetic biasing to a magnetoresistive (MR) layer within a magnetoresistive (MR) sensor element within the magnetoresistive (MR) read-write head (in order to provide noise free operation of the magnetoresistive (MR) sensor element); or (2) a transverse magnetic biasing to the magnetoresistive (MR) layer within the magnetoresistive (MR) sensor element within the magnetoresistive (MR) read-write head (in order to provide a linear response of the magnetoresistive (MR) sensor element). Longitudinal magnetic biasing is typically provided through antiferromagnetic coupling of patterned antiferromagnetic material layers contacting opposite ends of the magnetoresistive (MR) layer within the magnetoresistive (MR) sensor element, while transverse magnetic biasing is typically provided through forming either in contact with or separated from the magnetoresistive (MR) layer by a conductor spacer layer a soft adjacent layer (SAL) of soft magnetic material, typically at least substantially co-extensive with the magnetoresistive (MR) layer within the magnetoresistive (MR) sensor element.

While transverse magnetically biased soft adjacent layer (SAL) magnetoresistive (MR) sensor elements provide generally enhanced linearity and performance with respect to otherwise equivalent magnetoresistive (MR) sensor elements absent soft adjacent layer (SAL) transverse magnetic biasing, soft adjacent layer (SAL) magnetoresistive (MR) sensor elements are not entirely without problems. In particular, soft adjacent layer (SAL) magnetoresistive (MR) sensor elements when conventionally fabricated with a conductor spacer layer or soft adjacent layer (SAL) contacting a magnetoresistive (MR) layer within the soft adjacent layer (SAL) magnetoresistive (MR) sensor element suffer from problems including but not limited to: (1) current shunting through either or both the conductor spacer layer and the soft adjacent layer (SAL) (which leads to reduced signal amplitude of the magnetoresistive (MR) sensor element); and (2) thermal annealing induced elemental interdiffusion of the conductor spacer layer or the soft adjacent layer (SAL) with the magnetoresistive (MR) layer (which similarly also leads to reduced signal amplitude of the magnetoresistive (MR) sensor element). It is thus towards the goal of fabricating soft adjacent layer (SAL) magnetoresistive (MR) sensor elements which simultaneously avoid: (1) current shunting into conductor spacer layers or soft adjacent layers (SALs) adjoining magnetoresistive (MR) layers within the soft adjacent layer (SAL) magnetoresistive (MR) sensor elements; and (2) thermal annealing induced elemental interdiffusion of conductor spacer layers or soft adjacent layers (SALs) adjoining magnetoresistive (MR) layers within those soft adjacent layer (SAL) magnetoresistive (MR) sensor elements that the present invention is generally directed.

Various soft adjacent layer (SAL) magnetoresistive (MR) sensor elements have been disclosed in the art of magnetoresistive (MR) sensor element fabrication.

For example, Beaulieu et al., in U.S. Pat. No. 3,864,751 disclose a soft adjacent layer (SAL) magnetoresistive (MR) sensor element comprising a magnetoresistive (MR) layer separated from a soft adjacent layer (SAL) by a dielectric layer. The soft adjacent layer (SAL) magnetoresistive (MR) sensor element provides for independent electrical biasing of the soft adjacent layer (SAL) with respect to the magnetoresistive (MR) layer.

In addition, Bajorek et al., in U.S. Pat. No. 4,024,489 disclose a soft adjacent layer (SAL) magnetoresistive (MR) sensor element comprising a magnetoresistive (MR) layer separated from a soft adjacent layer (SAL) by a relatively high resistivity conductor layer. The soft adjacent layer (SAL) magnetoresistive (MR) sensor element so formed avoids dielectric breakdown problems and spurious signal problems observed within the soft adjacent layer (SAL) magnetoresistive (MR) sensor element disclosed by Beaulieu et al.

Further, Krounbi et al., in U.S. Pat. No. 4,713,708 discloses a soft adjacent layer (SAL) magnetoresistive (MR) sensor element comprising a magnetoresistive (MR) layer having a central region separated from a soft adjacent layer (SAL) by a tantalum spacer layer, while a pair of end regions of the magnetoresistive (MR) layer contact the soft adjacent layer (SAL). The magnetoresistive (MR) layer is farther longitudinally magnetically biased through patterned anti-ferromagnetic longitudinal magnetic bias layers coupled with the end regions of the magnetoresistive (MR) layer.

Yet further, Fontana Jr., et al., in U.S. Pat. No. 4,879,619 disclose a soft adjacent layer (SAL) magnetoresistive (MR) sensor element comprising a magnetoresistive (MR) layer separated from a soft adjacent layer (SAL) by a spacer layer formed from a nichrome alloy or a nichrome alloy doped with chromium oxide. Within the soft adjacent layer (SAL) magnetoresistive (MR) sensor element so formed, the resistivity of the spacer layer may be variably adjusted.

Finally, Nix et al., in U.S. Pat. No. 5,532,892 disclose a soft adjacent layer (SAL) magnetoresistive (MR) sensor element comprising a magnetoresistive (MR) layer having a permanent magnet layer formed at each of its ends, where the magnetoresistive (MR) layer and the permanent magnet layers are separated by a tantalum or titanium spacer layer from a soft adjacent layer (SAL). The soft adjacent layer (SAL) magnetoresistive (MR) sensor element so formed has a natural magnetic flux closure design.

Desirable in the art of soft adjacent layer (SAL) magnetoresistive (MR) sensor element fabrication are additional soft adjacent layer (SAL) magnetoresistive (MR) sensor elements which avoid: (1) signal amplitude degradation due to current shunting of conductor spacer layers or soft adjacent layers (SALs) contacting magnetoresistive (MR) layers within those soft adjacent layer (SAL) magnetoresistive (MR) sensor elements; and (2) signal amplitude degradation due to thermal annealing induced elemental interdiffusion of magnetoresistive (MR) layers with conductor spacer layers or soft adjacent layers (SALs) contacting those magnetoresistive (MR) layers within those soft adjacent layer (SAL) magnetoresistive (MR) sensor elements. More desirable in the art are soft adjacent layer (SAL) magnetoresistive (MR) sensor elements which achieve the foregoing objects while simultaneously being readily manufacturable. Most desirable in the art are soft adjacent layer (SAL) magnetoresistive (MR) sensor elements which achieve the foregoing objects while being readily manufacturable and avoiding problems as inherent within the soft adjacent layer (SAL) magnetoresistive (MR) sensor elements as disclosed by Beaulieu et al. and discussed within Bajorek et al., above. The teachings of Beaulieu et al. and Bajorek et al. are incorporated herein fully by reference. It is towards the foregoing goals that the present invention is more specifically directed.

SUMMARY OF THE INVENTION

A first object of the present invention is to provide a soft adjacent layer (SAL) magnetoresistive (MR) sensor element and a method for fabricating the soft adjacent layer (SAL) magnetoresistive (MR) sensor element, wherein there is avoided signal amplitude degradation of the soft adjacent layer (SAL) magnetoresistive (MR) sensor element due to current shunting through a conductor spacer layer or soft adjacent layer (SAL) contacting the magnetoresistive (MR) layer within the soft adjacent layer (SAL) magnetoresistive (MR) sensor element.

A second object of the present invention is to provide a soft adjacent layer (SAL) magnetoresistive (MR) sensor element and a method for fabricating the soft adjacent layer (SAL) magnetoresistive (MR) sensor element, wherein there is avoided signal amplitude degradation of the soft adjacent layer (SAL) magnetoresistive (MR) sensor element due to thermal annealing induced elemental interdiffusion of a conductor spacer layer or soft adjacent layer (SAL) contacting the magnetoresistive (MR) layer within the soft adjacent layer (SAL) magnetoresistive (MR) sensor element.

A third object of the present invention is to provide a soft adjacent layer (SAL) magnetoresistive (MR) sensor element in accord with the first object of the present invention or the second object of the present invention, where the method through which is fabricated the soft adjacent layer (SAL) magnetoresistive (MR) sensor element is readily manufacturable.

A fourth object of the present invention is to provide a soft adjacent layer (SAL) magnetoresistive (MR) sensor element in accord with the first object of the present invention or the second object of the present invention, where there is avoided problems as inherent within the soft adjacent layer (SAL) magnetoresistive (MR) sensor element as disclosed within Beaulieu et al. and discussed within Bajorek et al., above.

In accord with the objects of the present invention, there is provided by the present invention a soft adjacent layer (SAL) magnetoresistive (MR) sensor element and a method for fabricating the soft adjacent layer (SAL) magnetoresistive (MR) sensor element. To practice the method of the present invention, there is first provided a substrate. There is formed over the substrate a dielectric layer which has a first surface of the dielectric layer and a second surface of the dielectric layer opposite the first surface of the dielectric layer. There is also formed over the substrate a magnetoresistive (MR) layer contacting the first surface of the dielectric layer. Similarly, there is also formed over the substrate a soft adjacent layer (SAL) contacting the second surface of the dielectric layer. Within the magnetoresistive (MR) sensor element formed through the method of the present invention, each of the dielectric layer, the magnetoresistive (MR) layer and the soft adjacent layer (SAL) is planar. Preferably, the dielectric layer, the magnetoresistive (MR) layer and the soft adjacent layer (SAL) are at least substantially co-extensive. The method of the present invention contemplates the soft adjacent layer (SAL) magnetoresistive (MR) sensor element formed through the method of the present invention.

There is provided through the present invention a soft adjacent layer (SAL) magnetoresistive (MR) sensor element, where there is avoided signal amplitude degradation of the soft adjacent layer (SAL) magnetoresistive (MR) sensor element due to either: (1) current shunting through a conductor spacer layer or soft adjacent layer (SAL) contacting the magnetoresistive (MR) layer within the soft adjacent layer (SAL) magnetoresistive (MR) sensor element; or (2) thermal annealing induced elemental interdiffusion of a conductor spacer layer or soft adjacent layer (SAL) contacting the magnetoresistive (MR) layer within the soft adjacent layer (SAL) magnetoresistive (MR) sensor element. The present invention realizes the foregoing objects by forming within the soft adjacent layer (SAL) magnetoresistive (MR) sensor element of the present invention a magnetoresistive (MR) layer separated from a soft adjacent layer (SAL) by a dielectric spacer layer rather than a conductor spacer layer.

There is provided by the present invention a soft adjacent layer (SAL) magnetoresistive (MR) sensor element where there is also avoided problems as inherent within the soft adjacent layer (SAL) magnetoresistive (MR) sensor element as disclosed within Beaulieu et al. and discussed within Bajorek et al., above. The present invention realizes the foregoing object by forming within the soft adjacent layer (SAL) magnetoresistive (MR) sensor element of the present invention the magnetoresistive (MR) layer, the soft adjacent layer (SAL) and the dielectric spacer layer as planar layers.

The method through which is formed the soft adjacent layer (SAL) magnetoresistive (MR) sensor element of the present invention is readily manufacturable. As is illustrated within the preferred embodiment of the present invention, the soft adjacent layer (SAL) magnetoresistive (MR) sensor element of the present invention may be formed through a photolithographic and etch method employing fabrication apparatus generally known within the art of magnetic read-write head fabrication. Thus, the method through which is formed the soft adjacent layer (SAL) magnetoresistive (MR) sensor element of the present invention is readily manufacturable.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a soft adjacent layer (SAL) magnetoresistive (MR) sensor element and a method for fabricating the soft adjacent layer (SAL) magnetoresistive (MR) sensor element, where there is avoided within the soft adjacent layer (SAL) magnetoresistive (MR) sensor element signal amplitude degradation due to either: (1) current shunting through a conductor spacer layer or soft adjacent layer (SAL) contacting the magnetoresistive (MR) layer within the soft adjacent layer (SAL) magnetoresistive (MR) sensor element; or (2) thermal annealing induced elemental interdiffusion of a conductor spacer layer or soft adjacent layer (SAL) contacting the magnetoresistive (MR) layer within the soft adjacent layer (SAL) magnetoresistive (MR) sensor element, while simultaneously avoiding problems as inherent within the soft adjacent layer (SAL) magnetoressitive (MR) sensor element as disclosed within Beaulieu et al. and discussed within Bajorek et al., above. The present invention realizes the foregoing objects by forming within the soft adjacent layer (SAL) magnetoresistive (MR) sensor element of the present invention a magnetoresistive (MR) layer separated from a soft adjacent layer (SAL) by a dielectric spacer layer rather than a conductor spacer layer, where the magnetoresistive (MR) layer, the soft adjacent layer (SAL) and the dielectric spacer layer are planar.

Although the soft adjacent layer (SAL) magnetoresistive (MR) sensor element of the present invention may be employed in fabricating soft adjacent layer (SAL) magnetoresistive (MR) sensors employed in various applications, including but not limited to analog magnetic signal sensing applications and digital magnetic signal sensing applications, the soft adjacent layer (SAL) magnetoresistive (MR) sensor element of the present invention is preferably employed within, and particularly suited to forming, a magnetoresistive (MR) read-write head employed in reading and writing digitally encoded magnetic data into and from a magnetic data storage medium employed within a direct access storage device (DASD) employed within digitally encoded magnetic data storage and retrieval.

Figure 1:
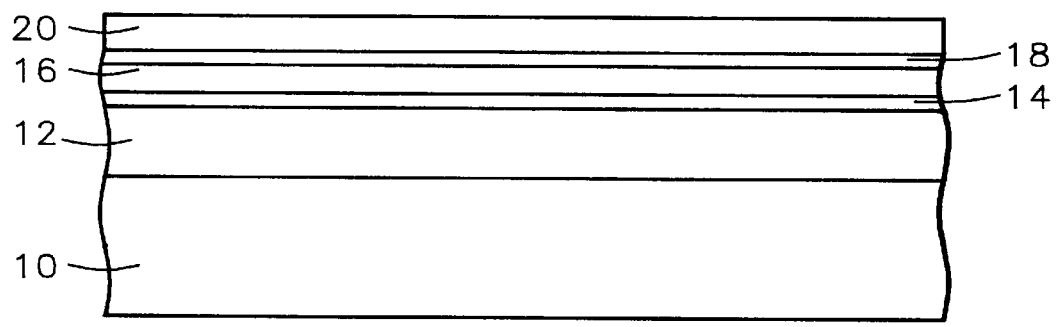
FIG. 1 to FIG. 7 show a series of schematic cross-sectional diagrams illustrating the results of progressive stages in forming a soft adjacent layer (SAL) magnetoresistive (MR) sensor element in accord with a preferred embodiment of the present invention.

Referring now to FIG. 1 to FIG. 7, there is shown a series of schematic cross-sectional diagrams illustrating the results of progressive stages in forming a soft adjacent layer (SAL) magnetoresistive (MR) sensor element in accord with a preferred embodiment of the present invention. Shown in FIG. 1 is a schematic cross-sectional diagram illustrating the soft adjacent layer (SAL) magnetoresistive (MR) sensor element at an early stage in its fabrication.

Shown in FIG. 1 is a substrate 10 having formed thereupon or thereover five blanket layers. The five blanket layers include: (1) a blanket shield layer 12 formed upon the substrate 10; (2) a blanket first dielectric layer 14 formed upon the blanket shield layer 12; (3) a blanket soft adjacent layer (SAL) 16 formed upon the blanket first dielectric layer 14; (4) a blanket second dielectric spacer layer 18 formed upon the blanket soft adjacent layer (SAL) 16; and (5) a blanket magnetoresistive (MR) layer 20 formed upon the blanket second dielectric spacer layer 18. Each of the foregoing substrate and five blanket layers may be formed through methods and materials as are common in the art of soft adjacent layer (SAL) magnetoresistive (MR) sensor element fabrication.

For example, although it is known in the art that substrates within soft adjacent layer (SAL) magnetoresistive (MR) sensor element fabrication are typically formed from non-magnetic ceramic materials such as but not limited to oxides, nitrides, borides, carbides and mixtures of oxides, nitrides, borides and carbides, for the preferred embodiment of the present invention, the substrate 10 is preferably formed from a non-magnetic aluminum oxide/titanium carbide ceramic material. Preferably, the substrate 10 so formed is formed with sufficient dimensions to allow the substrate 10 to be fabricated into a slider employed within a direct access storage device (DASD) magnetic data storage enclosure employed within digitally encoded magnetic data storage and retrieval.

Similarly, although it is also known in the art soft adjacent layer (SAL) magnetoresistive (MR) sensor element fabrication that shield layers, soft adjacent layers (SALs) and magnetoresistive (MR) layers may be formed from any of several soft magnetic materials, including but not limited to permalloy (ie: nickel-iron alloy) soft magnetic materials and higher order alloy soft magnetic materials incorporating permalloy soft magnetic materials (ie: nickel-iron-rhodium soft magnetic materials and nickel-iron-chromium soft magnetic materials), for the preferred embodiment of the present invention, the blanket shield layer 12, the blanket soft adjacent layer (SAL) 16 and the blanket magnetoresistive (MR) layer 20 are each preferably formed of a permalloy (ie: nickel-iron 80:20 w/w) soft magnetic material. Preferably, the blanket shield layer 12 is formed to a thickness of from about 10000 to about 30000 angstroms, while the blanket soft adjacent layer (SAL) 16 is preferably formed to a thickness of from about 50 to about 500 angstroms and the blanket magnetoresistive (MR) layer 20 is preferably formed to a thickness of from about 50 to about 500 angstroms.

It is advantageous that the present invention and the preferred embodiment of the present invention allow the blanket shield layer 12, and in particular the blanket soft adjacent layer (SAL) 16 and the blanket magnetoresistive (MR) layer 20 to simultaneously be formed from the same soft magnetic material. Such advantage relates in large part to manufacturing efficiency and economy. Significantly, such advantage is inherently not realized within soft adjacent layer (SAL) magnetoresistive (MR) sensor elements where a soft adjacent layer (SAL) contacts a magnetoresistive (MR) layer within the soft adjacent layer (SAL) magnetoresistive (MR) sensor element.

With respect to the blanket first dielectric layer 14 and the blanket second dielectric spacer layer 18, although the blanket first dielectric layer 14 and the blanket second dielectric spacer layer 18 may be formed through methods and materials conventional in the art of soft adjacent layer (SAL) magnetoresistive (MR) sensor element fabrication, including but not limited to chemical vapor deposition (CVD) methods, plasma enhanced chemical vapor deposition (PECVD) methods and physical vapor deposition (PVD) sputtering methods through which may be formed blanket dielectric layers of dielectric materials including but not limited to silicon oxide dielectric materials, silicon nitride dielectric materials, nitrogenated carbon dielectric materials and aluminum oxide dielectric materials, for the preferred embodiment of the present invention, the blanket first dielectric layer 14 and the blanket second dielectric spacer layer 18 are each preferably formed of an aluminum oxide dielectric material deposited through a physical vapor deposition (PVD) sputtering method, as is most common in the art of magnetoresistive (NMR) sensor element fabrication. Preferably, the blanket first dielectric layer 14 so formed is formed to a thickness of from about 300 to about 2000 angstroms, while the blanket second dielectric spacer layer 18 so formed is preferably formed to a thickness of from about 50 to about 500 angstroms.

Figure 2:
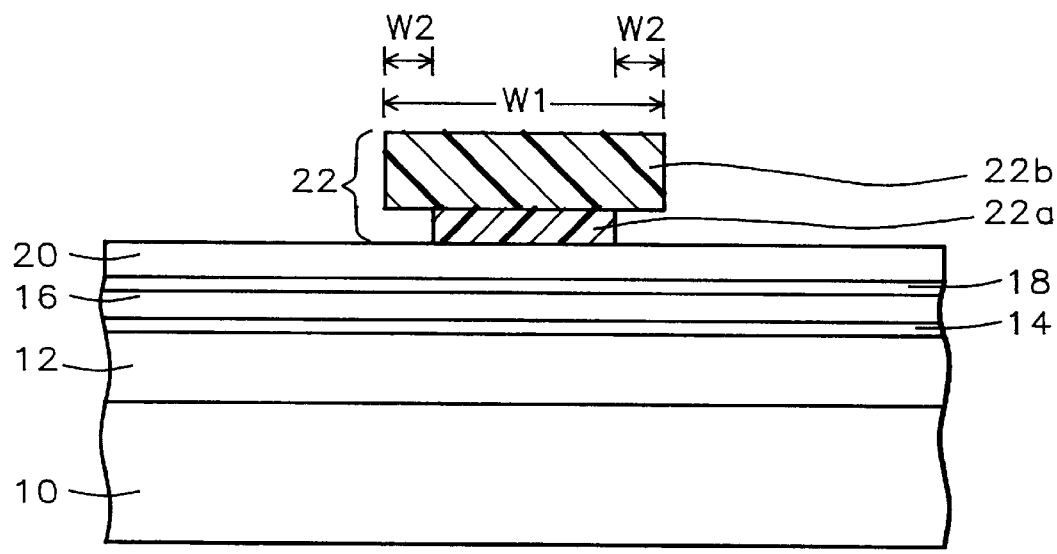

Referring now to FIG. 2, there is shown a schematic cross-sectional diagram illustrating the results of further processing of the soft adjacent layer (SAL) magnetoresistive (MR) sensor element whose schematic crosssectional diagram is illustrated in FIG. 1. Shown in FIG. 2 is the presence of a first photoresist lift off stencil 22 formed upon the blanket magnetoresistive (MR) layer 20. The first photoresist lift off stencil 22 comprises a patterned first release layer 22a formed upon the blanket magnetoresistive (MR) layer 20 and a patterned first photoresist layer 22b formed symmetrically overhanging the patterned first release layer 22b. While any of several release materials may be employed in forming the patterned first release layer 22b, including but not limited to organic polymer release materials such as but not limited to polysulfone release materials and polyimide release materials, for the preferred embodiment of the present invention, the patterned first release layer 22a is preferably formed of a polysulfone release material. Preferably, the patterned first release layer 22a is formed to a thickness of from about 500 to about 10000 angstroms upon the blanket magnetoresistive (MR) layer 20. Similarly, although any of several photoresist materials may be employed in forming the patterned first photoresist layer 22b, including but not limited to photoresist materials selected from the general groups of photoresist materials including but not limited to positive photoresist materials and negative photoresist materials, for the preferred embodiment of the present invention, the patterned first photoresist layer 22b is preferably formed of a positive photoresist material in order to provide optimal dimensional integrity when forming the first lift off stencil 22. Preferably, the patterned first photoresist layer 22b is formed to a thickness of from about 5000 to about 20000 angstroms.

In order to fabricate the first lift off stencil 22, there is first formed upon the blanket magnetoresistive (MR) layer 20 a blanket first release layer from which is formed the patterned first release layer 22a. There is then formed upon the blanket first release layer a blanket first photoresist layer from which is formed the patterned first photoresist layer 22b. The patterned first photoresist layer 22b is then photoexposed and developed from the blanket first photoresist layer. Finally, the patterned first release layer 22a is formed through etching the blanket first release layer within an isotropic etchant (typically an organic solvent) for a sufficient time to provide the uniform overhang of the patterned first photoresist layer 22b with respect to the patterned first release layer 22a. Preferably, the patterned first photoresist layer 22b has a width W1 over the blanket magnetoresistive (MR) layer 20 of from about 1 to about 10 microns, as illustrated in FIG. 2, while the patterned first photoresist layer 22b symetrically overhangs each edge of the patterned first release layer 22a by a width W2 of from about 0.1 to about 2.0 microns, as similarly illustrated in FIG. 2.

Figure 3:
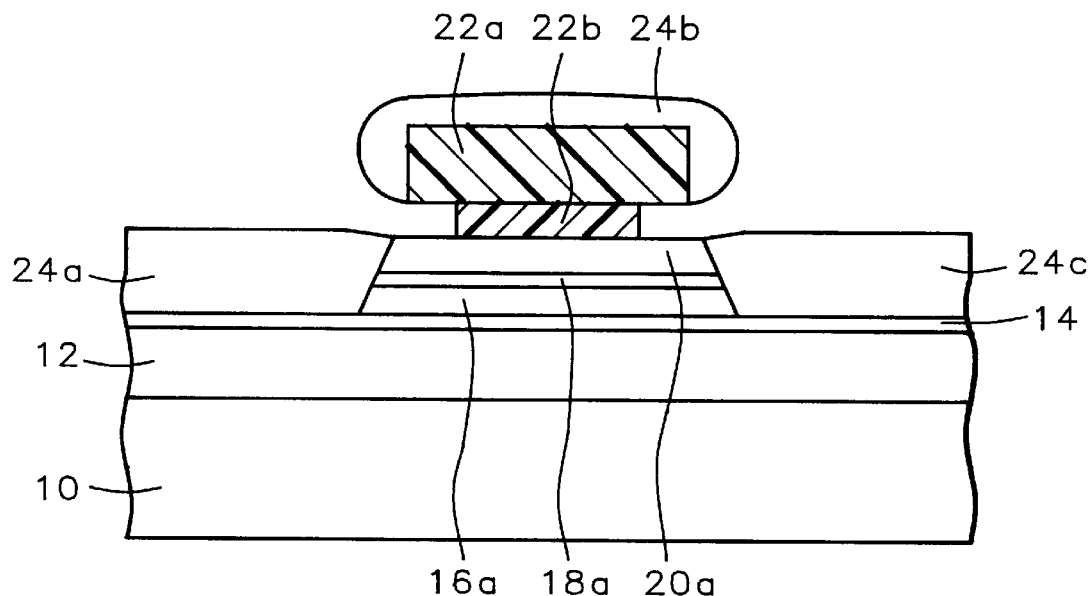

Referring now to FIG. 3, there is shown a schematic cross-sectional diagram illustrating the results of further processing of the soft adjacent layer (SAL) magnetoresistive (MR) sensor element whose schematic cross-sectional diagram is illustrated in FIG. 2.

Shown first in FIG. 3 is the results of sequentially etching the blanket magnetoresistive (MR) layer 20, the blanket second dielectric spacer layer 18 and the blanket soft adjacent layer (SAL) 16 to form a corresponding patterned soft adjacent layer (SAL) 16a, a corresponding patterned second dielectric spacer layer 18 a and a corresponding patterned magnetoresistive (MR) layer 20a while employing the first lift off stencil 22 as an etch mask. The foregoing blanket layers may be etched to form the corresponding patterned layers while employing the first lift off stencil 22 as an etch mask while employing etch methods as are conventional in the art of magnetoresistive (MR) sensor element fabrication, including but not limited to ion beam etch (IBE) methods, reactive ion beam etch (RIBE) methods, sputter etch methods and reactive sputter etch methods. For the preferred embodiment of the present invention the foregoing blanket layers are preferably etched to form the corresponding patterned layers through an ion beam etch (IBE) method employing argon ions, as is common in the art of magnetoresistive (MR) sensor element fabrication. The ion beam etch (IBE) method preferably etches completely through the blanket magnetoresistive (MR) layer 20, the blanket second dielectric spacer layer 18 and the blanket soft adjacent layer 16 while not substantially etching the blanket first dielectric layer 14. The ion beam etch (IBE) method may be monitored and controlled through residual gas analysis methods and optical emission spectroscopy analysis methods as are conventional in the art.

As is illustrated in FIG. 3, the stack formed from the pattened soft adjacent layer (SAL) 16a, the patterned second dielectric spacer layer 18a and the patterned magnetoresistive (MR) layer 20a is typically formed with an outward taper of from about zero to about 45 degrees with respect to the orthogonal to the substrate 10, as is common in the art of ion beam etch (IBE) methods. Such outward taper typically occurs due to redeposition upon the first lift off stencil 22 of material sputtered from the blanket magnetoresistive (MR) layer 20, the blanket second dielectric spacer layer 18 and the blanket soft adjacent layer (SAL) 16 and the redeposited sputtered material's consequential shadowing of the ion beam employed within the ion beam etch (IBE) method. Alternative etch methods may provide a patterned magnetoresistive layer 20a, patterned second dielectric spacer layer 18a and patterned soft adjacent layer 16a stack with less taper. Thus, within the context of the method of the present invention, patterned soft adjacent layers such as the patterned soft adjacent layer (SAL) 16a, patterned dielectric spacer layers such as the patterned second dielectric spacer layer 18a and patterned magnetoresistive (MR) layers such as the patterned magnetoresistive (MR) layer 20a are generally at least substantially co-extensive. In that regard, use of the term "substantially co-extensive" within the specification and the claims is intended to accommodate the slight positive tapering inherently observed within patterned layers formed through etch methods such as but not limited to conventional ion beam etch (IBE) methods employed in forming those patterned layers within magnetoresistive (MR) sensor elements.

There is also shown in FIG. 3 the presence of: (1) a pair patterned third dielectric backfill layers 24a and 24c formed upon exposed portions of the blanket first dielectric layer 14; and (2) a patterned third dielectric backfill layer residue 24b formed upon the patterned first photoresist layer 22b. The patterned third dielectric backfill layers 24a and 24c and the patterned third dielectric backfill layer residue 24b are preferably formed through methods and materials analogous or equivalent to the methods and materials employed in forming the blanket first dielectric layer 14 and the blanket second dielectric spacer layer 18 as illustrated in FIG. 1. Preferably, the patterned third dielectric backfill layers 24a and 24c are each formed as is illustrated within FIG. 3, as a single layer dielectric layer formed to a thickness sufficient to fully encapsulate the exposed edges of the patterned soft adjacent layer (SAL) 16a, the patterned second dielectric spacer layer 18a and the patterned magnetoresistive (MR) layer 20a, which will preferably provide patterned third dielectric backfill layers 24a and 24c of from about 200 to about 2000 angstroms thickness each. As is illustrated within FIG. 3, neither of the patterned third dielectric backfill layers 24a and 24c completely covers the patterned soft adjacent layer 16a, the patterned second dielectric spacer layer 18a or the patterned magnetoresistive (MR) layer 20a. Different deposition methods employed in forming the patterned third dielectric backfill layers 24a and 24c will typically provide slight variations in the level of encapsulation of the exposed edges of the patterend soft adjacent layer (SAL) 16a, the patterned second dielectric spacer layer 18a and the patterned magnetoresistive (MR) layer 20a.

Figure 4:
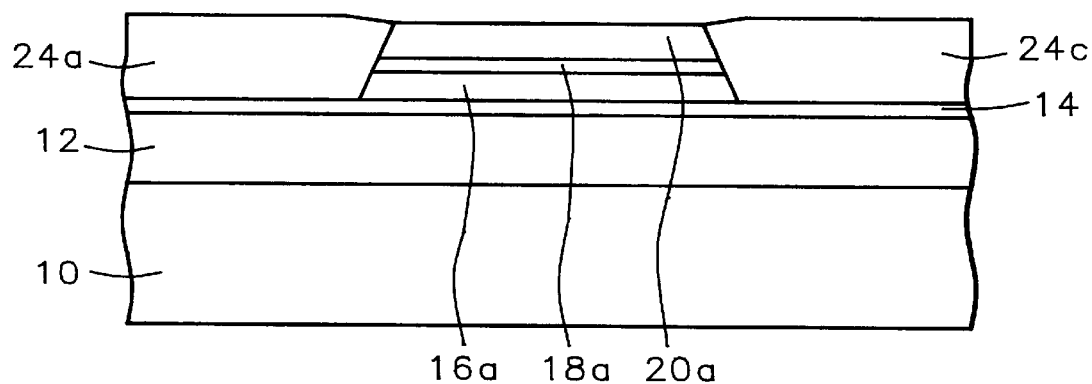

Referring now to FIG. 4, there is shown a schematic cross-sectional diagram illustrating the results of further processing of the soft adjacent layer (SAL) magnetoresistive (MR) sensor element whose schematic cross-sectional diagram is illustrated in FIG. 3. Shown in FIG. 4 is a schematic cross-sectional diagram of a soft adjacent layer (SAL) magnetoresistive (MR) sensor element otherwise equivalent to the soft adjacent layer (SAL) magnetoresistive (MR) sensor element whose schematic cross-sectional diagram is illustrated in FIG. 3, but from whose patterned magnetoresistive (MR) layer 20a has been stripped the first lift off stencil 22, which simultaneously removes with it the patterned third dielectric backfill layer residue 24b. The first lift off stencil 22 is preferably stripped from the soft adjacent layer (SAL) magnetoresistive (MR) sensor element whose schematic cross-sectional diagram is illustrated in FIG. 3 to provide the soft adjacent layer (SAL) magnetoresistive (MR) sensor element whose schematic cross-sectional diagram is illustrated in FIG. 4 through methods as are conventional in the art of lift off stencil fabrication and removal, which methods will typically employ organic solvent materials, such as but no limited to acetone, tetrahydrofiran (THF) and N-methylpyrrolidone solvent materials.

Figure 5:
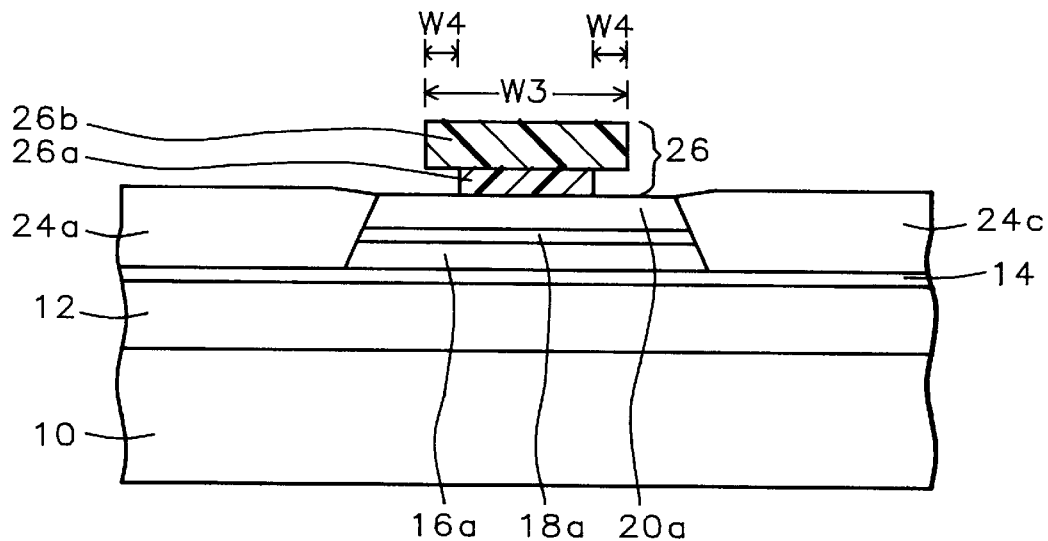

Referring not to FIG. 5, there is shown a schematic cross-sectional diagram illustrating the results of further processing of the soft adjacent layer (SAL) magnetoresistive (MR) sensor element whose schematic cross-sectional diagram is illustrated in FIG. 4. Shown in FIG. 5 is a schematic cross-sectional diagram of a soft adjacent layer (SAL) magnetoresistive (MR) sensor element otherwise equivalent to the soft adjacent layer (SAL) magnetoresistive (MR) sensor element whose schematic cross-sectional diagram is illustrated in FIG. 4, but wherein approximately centered upon whose patterned magnetoresistive (MR) layer 20a is formed a second lift off stencil 26 comprising a patterned second release layer 26a formed upon the pattened magnetoresistive (MR) layer 20a and a pattened second photoresist layer 26b formed overhanging upon the patterned second release layer 26a. The patterned second lift off stencil 26 is preferably formed through methods and materials analogous or equivalent to the methods and materials employed in forming the first lift off stencil 22 as illustrated in FIG. 2. Preferably, the thickness of the patterned second release 26a is from about 500 to about 10000 angstroms while the thickness of the patterned second photoresist layer 26b is from about 5000 to about 20000 angstroms. Preferably, the patterned second photoresist layer 26b is formed with a width W3 over the patterned magnetoresistive (MR) layer 20a of from about 0.1 to about 5 microns, while the patterned second photoresist layer 26b preferably overhangs each edge of the patterned second release 26a by a width W4 preferably from about 0.03 to about 2 microns, where W3 and W4 are also illustrated in FIG. 5.

Figure 6:
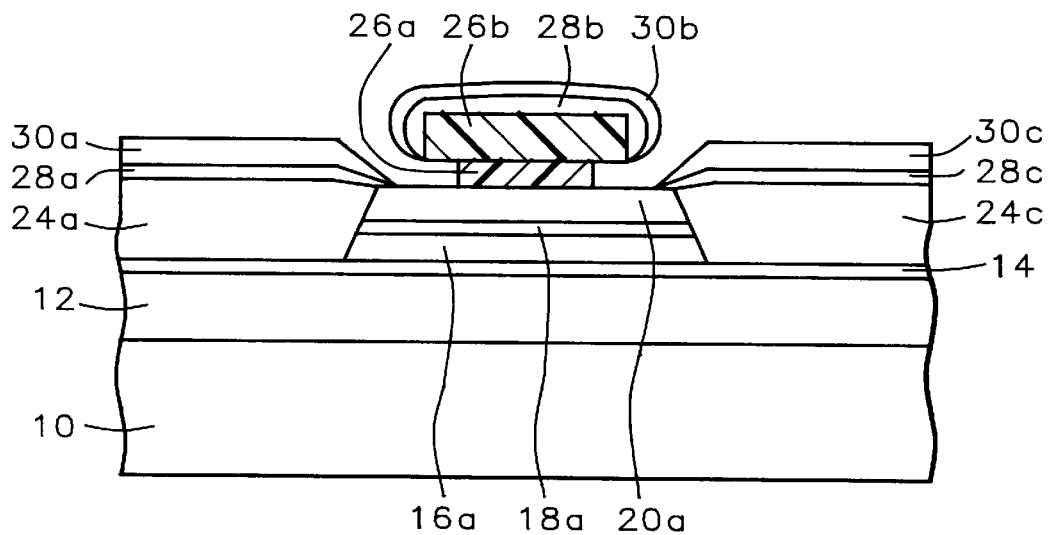

Referring now to FIG. 6, there is shown a schematic cross-sectional diagram illustrating the results of further processing of the soft adjacent layer (SAL) magnetoresistive (MR) sensor element whose schematic cross-sectional diagram is illustrated in FIG. 5. Shown in FIG. 6 is the results of forming upon or over the soft adjacent layer (SAL) magnetoresistive (MR) sensor element whose schematic cross-sectional diagram is illustrated in FIG. 5: (1) a pair of patterned antiferrornagnetic longitudinal magnetic biasing layers 28a and 28c (or alternatively a pair of patterned permanent magnet layers) formed upon the corresponding patterned third dielectric backfill layers 24a and 24c and partially overlapping opposite ends of the patterned magnetoresistive (MR) layer 20a; (2) a pair of patterned conductor lead layers 30a and 30c formed upon the pair of patterned antiferromagnetic longitudinal magnetic biasing layers 28a and 28c; and (3) a patterned antiferromagnetic longitudinal magnetic biasing layer residue 28b having formed thereupon a patterned conductor lead layer residue 30b, both of which are formed upon the patterned second photoresist layer 26b within the second lift-off stencil 26.

Methods and materials through which antiferromagnetic longitudinal magnetic biasing layers and conductor lead layers may be formed within magnetoresistive (MR) sensor elements are known in the art of magnetoresistive (MR) sensor element fabrication. In that regard, antiferromagnetic longitudinal magnetic biasing layers and conductor lead layers are typically, although not exclusively, formed within magnetoresistive (MR) sensor elements through methods including but not limited to thermally assisted evaporation methods, electron beam assisted evaporation methods and physical vapor deposition (PVD) sputtering methods. In addition, antiferromagnetic longitudinal magnetic biasing layers are typically formed within magnetoresistive (MR) sensor elements from hard magnetic materials such as but not limited to iron-manganese alloy hard magnetic materials, nickel-manganese alloy hard magnetic materials, chromium-cobalt alloy hard magnetic materials and rare earth alloy hard magnetic materials. Conductor lead layers are typically formed within magnetoresistive (MR) sensor elements from conductor materials including but not limited to aluminum, aluminum alloy, copper, copper alloy, gold and gold alloy conductor materials. For the preferred embodiment of the soft adjacent layer (SAL) magnetoresistive (MR) sensor element of the present invention, the patterned antiferromagnetic longitudinal magnetic biasing layers 28a and 28c, and the patterned antiferromagnetic longitudinal magnetic biasing layer residue 28b, are each preferably formed of an iron-manganese (50:50 w/w) or nickel-manganese antiferromagnetic material formed to a thickness of from about 100 to about 1000 angstroms, as is common in the art of magnetoresistive (MR) sensor element fabrication. Similarly, for the preferred embodiment of the soft adjacent layer (SAL) magnetoresistive (MR) sensor element of the present invention, the patterned conductor lead layers 30a and 30c, and the patterned conductor lead layer residue 30b are each preferably formed of a gold or gold alloy conductor material formed to a thickness of from about 300 to about 1000 angstroms, as is similarly common in the art of magnetoresistive (MR) sensor element fabrication.

Figure 7:
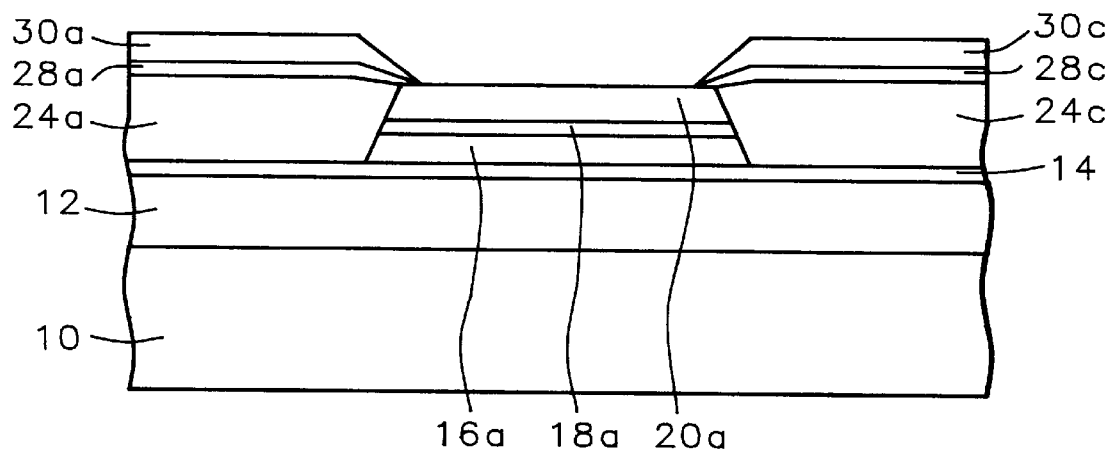

Referring now to FIG. 7, there is shown a schematic cross-sectional diagram illustrating the results of further processing of the soft adjacent layer (SAL) magnetoresistive (MR) sensor element whose schematic cross-sectional diagram is illustrated in FIG. 6. Shown in FIG. 7 is a schematic cross-sectional diagram of a soft adjacent layer (SAL) magnetoresistive (MR) sensor element otherwise equivalent to the soft adjacent layer (SAL) magnetoresistive (MR) sensor element whose schematic cross-sectional diagram is illustrated in FIG. 6, but from whose patterned magnetoresistive (MR) layer 20a is stripped the second lift off stencil 26, simultaneously removing with it the patterned antiferromagnetic longitudinal magnetic biasing layer residue 28b and the patterned conductor lead layer residue 30b. The second lift off stencil 26 is preferably stripped from the soft adjacent layer (SAL) magnetoresistive (MR) sensor element whose schematic cross-sectional diagram is illustrated in FIG. 6 to provide the soft adjacent layer (SAL) magnetoresistive (MR) sensor element whose schematic cross-sectional diagram is illustrated in FIG. 7 through methods and materials analogous or equivalent to the methods and materials through which the first lift off stencil 22 is stripped from the soft adjacent layer (SAL) magnetoresistive (MR) sensor element whose schematic cross-sectional diagram is illustrated in FIG. 3 to provide the soft adjacent layer (SAL) magnetoresistive (MR) sensor element whose schematic cross-sectional diagram is illustrated in FIG. 4.

Figure 8:
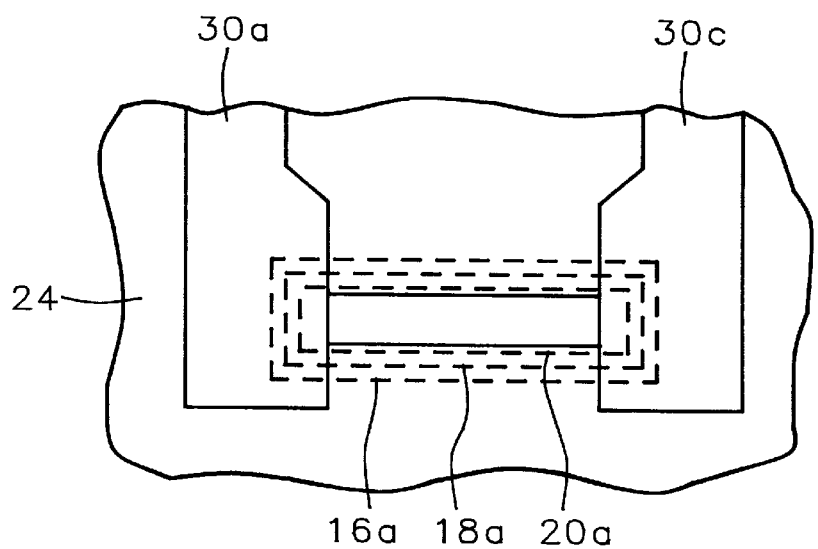
FIG. 8 shows a schematic plan-view diagram of a soft adjacent layer (SAL) magnetoresistive (MR) sensor element corresponding with the soft adjacent layer (SAL) magnetoresistive (MR) sensor element whose schematic cross-sectional diagram is shown in FIG. 7.

Referring now to FIG. 8, there is shown a schematic plan-view diagram corresponding with the schematic cross-sectional diagram of FIG. 7. Shown in FIG. 8 are the outlines of the patterned soft adjacent layer 16a, the patterned second dielectric spacer layer 18a and the patterned magnetoresistive (MR) layer 20a formed beneath the patterned third dielectric backfill layer 24, and the outlines of the patterned conductor lead layers 30a and 30c formed over the patterned third dielectric backfdill layer 24.

Upon removing from the soft adjacent layer (SAL) magnetoresistive (MR) sensor element whose schematic cross-sectional diagram is illustrated in FIG. 6 the second photoresist lift off stencil 26 to form the soft adjacent layer (SAL) magnetoresistive (MR) sensor element whose schematic cross-sectional diagram is illustrated in FIG. 7 or whose schematic plan-view diagram is illustrated in FIG. 8, there is formed the soft adjacent layer (SAL) magnetoresistive (MR) sensor element of the preferred embodiment of the present invention. The soft adjacent layer (SAL) magnetoresistive (MR) sensor element so formed has improved signal amplitude since there is avoided within the soft adjacent layer (SAL) magnetoresistive (MR) sensor element of the present invention current shunting or elemental interdiffusion of a magnetoresistive (MR) layer with a conductor spacer layer or a soft adjacent layer (SAL) contacting the magnetoresistive (MR) layer. Such signal amplitude improvement is achieved while avoiding problems inherent within the soft adjacent layer (SAL) magnetoresistive sensor element as disclosed within Beaulieu et al. and discussed within Bajorek et al., above.

As is understood by a person skilled in the art, there may be employed within the soft adjacent layer (SAL) magnetoresistive (MR) sensor element whose schematic cross-sectional diagram is illustrated in FIG. 7 additional layers as are conventionally required or desired to form from the soft adjacent layer (SAL) magnetoresistive (MR) sensor element whose schematic cross-sectional diagram is illustrated in FIG. 7 a soft adjacent layer (SAL) magnetoresistive (MR) read-write head. Such additional layers may include, but are not limited to, additional shield layers, additional dielectric layers, magnetic inductor layers, conductor layers, interconnection layers and passivation layers. Such additional layers may be formed through methods and materials, and with dimensions, otherwise equivalent to the methods, materials and dimensions through which such additional layers are conventionally formed within magnetoresistive (MR) read-write heads.

As is similarly understood by a person skilled in the art, although the soft adjacent layer (SAL) magnetoresistive (MR) sensor element of the preferred embodiment of the present invention illustrates the patterned magnetoresistive (MR) layer 20a separated from the patterned soft adjacent layer (SAL) 16a by the patterned second dielectric spacer layer 18a, where the patterned soft adjacent layer (SAL) 16a is formed most closely to the substrate 10, a soft adjacent layer (SAL) magnetoresistive (MR) sensor element having an inverted ordering of a patterned magnetoresistive (MR) layer such as the patterned magnetoresistive (MR) layer 20a, a patterned dielectric layer such as the patterned second dielectric spacer layer 18a and a patterned soft adjacent layer (SAL) such as the patterned soft adjacent layer (SAL) 16a with respect to a substrate such as the substrate 10 is also within the scope of the present invention, provided that the patterned magnetoresistive (MR) layer, the patterned dielectric layer and the patterned soft adjacent layer (SAL) are still planar and preferably at least partially co-extensive. Such an inverted ordering of the patterned magnetoresistive (MR) layer, the patterned dielectric layer and the patterned soft adjacent layer (SAL) is typically not preferred within the present invention, since there typically exists fabrication difficulties in providing a planar substrate upon which may be formed the patterned magnetoresistive (MR) layer, the patterned dielectric layer and the patterned soft adjacent layer (SAL) while simultaneously providing patterned antiferromagnetic longitudinal magnetic biasing layers or patterned conductor lead layers in contact with the patterned magnetoresistive (MR) layer.

Similarly, although the preferred embodiment of the present invention illustrates the patterned antiferromagnetic longitudinal magnetic biasing layers 28a and 28c and the patterned conductor lead layers 30a and 30c formed through a lift off stencil method, alternative methods may be employed within the method of the present invention for forming patterned antiferromagnetic longitudinal magnetic biasing layers, such as the patterned antiferromagnetic longitudinal magnetic biasing layers 28a and 28c, and patterned conductor lead layers, such as the patterned conductor lead layers 30a and 30c, upon opposite ends of a patterned magnetoresistive (MR) layer, such as the patterned magnetoresistive (MR) layer 20a. Such alternative methods may include, but are not limited to, blanket passivation and subsequent etch methods through which a blanket passivation layer is formed upon a patterned magnetoresistive (MR) layer and subsequently etched to provide a pair of vias accessing opposite ends of the patterned magnetoresistive (MR) layer.

Finally, as is also similarly understood by a person skilled in the art, the preferred embodiment of the present invention is illustrative of the present invention rather than limiting of the present invention. Revisions and modifications may be made to materials, structures and dimensions through which is provided the soft adjacent layer (SAL) magnetoresistive (MR) sensor element of the preferred embodiment of the present invention while still providing a soft adjacent layer (SAL) magnetoresistive (MR) sensor element within the spirit and scope of the present invention, as defined by the accompanying claims.

What is claimed is:

1. A method for fabricating a magnetoresistive (MR) sensor element comprising:
    providing a substrate;
    forming over the substrate a dielectric spacer layer, the dielectric spacer layer having a first surface of the dielectric spacer layer and a second surface of the dielectric spacer layer opposite the first surface of the dielectric spacer layer;
    forming over the substrate a magnetoresistive (MR) layer in contact with the first surface of the dielectric spacer layer;
    forming over the substrate a soft adjacent layer (SAL) in contact with the second surface of the dielectric spacer layer, where each of the magnetoresistive (MR) layer, the soft adjacent layer (SAL) and the dielectric spacer layer is planar; and
    forming then over the substrate a second dielectric spacer layer fully encapsulating and passivating a series of exposed edges of the magnetoresistive (MR) layer, the soft adjacent layer (SAL) and the dielectric layer.

2. The method of claim 1 wherein the magnetoresistive (MR) layer, the soft adjacent layer (SAL) and the dielectric spacer layer are co-extensive.

3. The method of claim 1 wherein:
    the magnetoresistive (MR) layer is formed from a magnetoresistive (MR) material selected from the group of magnetoresistive (MR) materials consisting of permalloy alloys and higher order alloys incorporating permalloy alloys;
    the dielectric spacer layer is formed from a dielectric material selected from the group of dielectric materials consisting of aluminum oxide, silicon oxide and nitrogenated carbon dielectric materials; and
    the soft adjacent layer (SAL) is formed from a soft magnetic material selected from the group of soft magnetic materials consisting of permalloy alloys and higher order alloys incorporating permalloy alloys.

4. The method of claim 3 wherein the magnetoresistive (MR) layer and the soft adjacent layer (SAL) are formed of the same material.

5. The method of claim 2 wherein:
    the magnetoresistive (MR) layer, the soft adjacent layer (SAL) and the dielectric spacer layer are formed from a corresponding blanket magnetoresistive (MR) layer, a corresponding blanket soft adjacent layer (SAL) and a corresponding blanket dielectric spacer layer through an etch method employing a lift off stencil as an etch mask; and
    the lift off stencil is subsequently employed in forming the backfill dielectric layer fully encapsulating and passivating the series of edges of the magnetoresistive (MR) layer, the soft adjacent layer (SAL) and the dielectric spacer layer.

6. The method of claim 5 wherein the etch method is selected from the group of etch methods consisting of ion beam etch (IBE) methods, reactive ion beam etch (RIBE) methods, sputtering etch methods and reactive sputtering etch methods.

7. The method of claim 1 further comprising forming a pair of patterned layers magnetically coupled with a pair of opposite ends of the magnetoresistive (MR) layer, the pair of patterned layers being selected from the group of patterned layers consisting of patterned antiferromagnetic longitudinal magnetic bias layers and patterned permanent magnet bias layers, where the pair of patterned antiferromagnetic longitudinal magnetic bias layers is formed of a hard magnetic material selected from the group of hard magnetic materials consisting of iron-manganese alloy, nickel-manganese alloy, cobalt-chromium alloy and rare earth alloy hard magnetic materials.

8. The method of claim 1 wherein the backfill dielectric layer is a single layer backfill dielectric layer.

9. The method of claim 1 wherein the backfill dielectric layer does not completely cover any one of the magnetoresistive (MR) layer, the soft adjacent layer (SAL) and the dielectric spacer layer.

* * * * *